(12) United States Patent
Mizuno et al.

(10) Patent No.: US 10,020,291 B2
(45) Date of Patent: Jul. 10, 2018

(54) LED LIGHT EMITTING DEVICE

(71) Applicants: CITIZEN ELECTRONICS CO., LTD., Fujiyoshida, Yamanashi (JP); CITIZEN WATCH CO., LTD., Tokyo (JP)

(72) Inventors: Toshiyuki Mizuno, Yamanashi (JP); Kazuya Ishihara, Tsuru (JP); Akira Watanabe, Fujiyoshida (JP); Yasuo Nakanishi, Yamanashi (JP)

(73) Assignees: CITIZEN ELECTRONICS CO., LTD., Yamanashi (JP); CITIZEN WATCH CO., LTD., Tokyo (JP)

( * ) Notice: Subject to any disclaimer, the term of this patent is extended or adjusted under 35 U.S.C. 154(b) by 0 days.

(21) Appl. No.: 14/739,343

(22) Filed: Jun. 15, 2015

(65) Prior Publication Data

US 2015/0364451 A1     Dec. 17, 2015

(30) Foreign Application Priority Data

Jun. 16, 2014  (JP) ................................ 2014-123269
May 12, 2015  (JP) ................................ 2015-097651

(51) Int. Cl.
*H01L 25/075* (2006.01)
*H01L 33/48* (2010.01)

(52) U.S. Cl.
CPC ..... *H01L 25/0753* (2013.01); *H01L 2224/48227* (2013.01)

(58) Field of Classification Search
None
See application file for complete search history.

(56) References Cited

U.S. PATENT DOCUMENTS

| | | | |
|---|---|---|---|
| 2009/0230413 A1* | 9/2009 | Kobayakawa | ........ H01L 33/483 257/91 |
| 2010/0207133 A1 | 8/2010 | Taguchi | |
| 2011/0186875 A1 | 8/2011 | Egoshi | |
| 2012/0132938 A1 | 5/2012 | Komatsu | |
| 2012/0307481 A1* | 12/2012 | Joo | ........................ H01L 33/60 362/97.1 |
| 2013/0020595 A1 | 1/2013 | Moriguchi | |
| 2013/0027930 A1 | 1/2013 | Kobayakawa | |

(Continued)

FOREIGN PATENT DOCUMENTS

| | | |
|---|---|---|
| JP | 2006237282 | 9/2006 |
| JP | 2007207834 | 8/2007 |

(Continued)

*Primary Examiner* — Samuel Gebremariam
*Assistant Examiner* — Jonas T Beardsley
(74) *Attorney, Agent, or Firm* — RatnerPrestia

(57) ABSTRACT

An LED light emitting device with good color mixing property is provided. The LED light emitting device including a rectangular substrate having a short-side and a long-side and a first LED element, a second LED element and a third LED element that are mounted on a surface of the substrate and emit light with wavelengths different from one another, wherein the first LED element and the second LED element are mounted on the substrate so that a first distance from the short-side to a mounting position of the first LED element in the long-side direction of the substrate and a second distance from the short-side to a mounting position of the second LED element in the long-side direction are the same.

5 Claims, 6 Drawing Sheets

(56) References Cited

U.S. PATENT DOCUMENTS

2013/0105825 A1* 5/2013 Liu ................... H01L 25/0753
                                                          257/88
2017/0040307 A1* 2/2017 Lee ..................... H01L 25/167

FOREIGN PATENT DOCUMENTS

| JP | 200921417 | 1/2009 |
| JP | 2011176264 | 9/2011 |
| JP | 2011233671 | 11/2011 |
| JP | 2012119376 | 6/2012 |
| JP | 2013026510 | 2/2013 |

\* cited by examiner

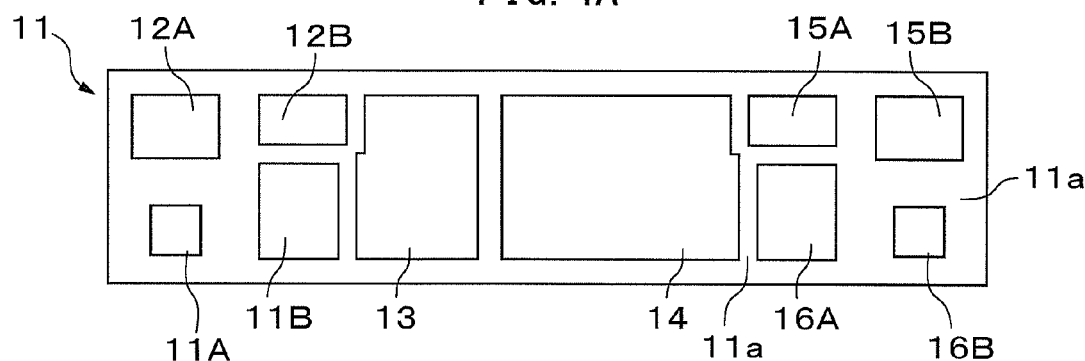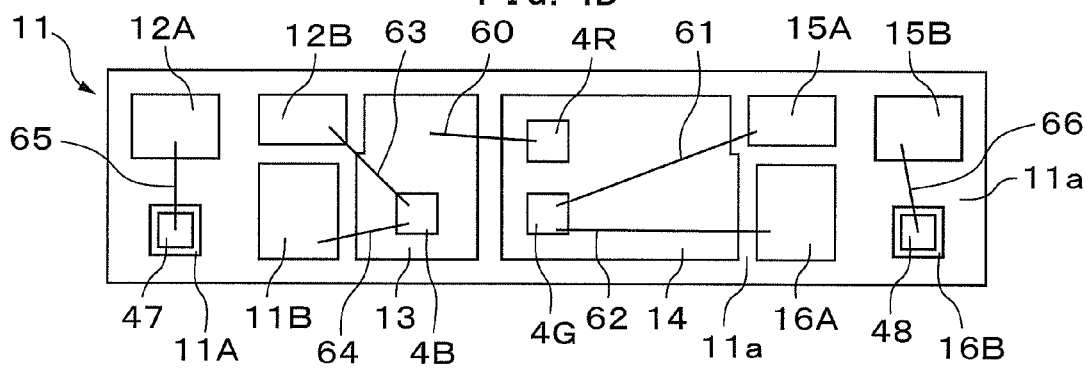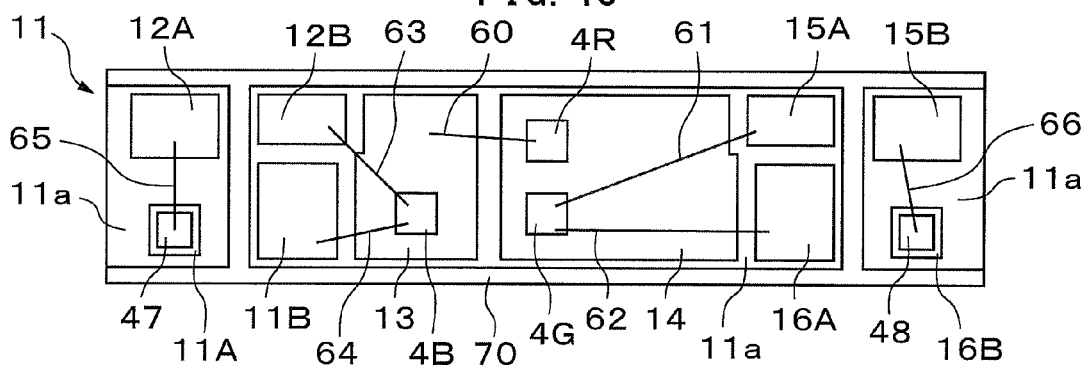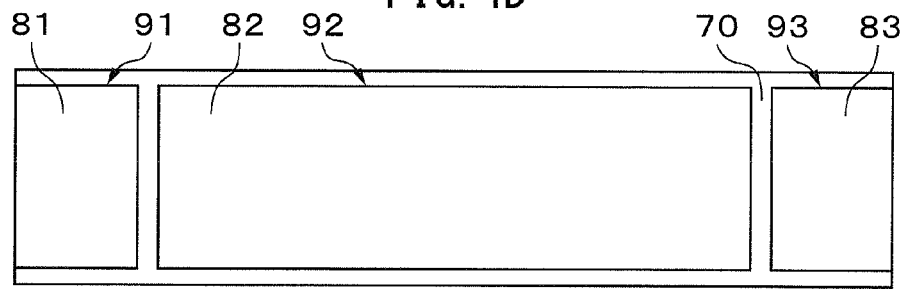

US 10,020,291 B2

LED LIGHT EMITTING DEVICE

CROSS-REFERENCES TO RELATED APPLICATION

This application is a new U.S. patent application that claims benefit of JP 2014-123269, filed on Jun. 16, 2014, the entire content of JP 2014-123269 is hereby incorporated by reference.

TECHNICAL FIELD

The present invention relates to an LED light emitting device, and in particular, an LED light emitting device in which a plurality of LED elements which emit light with wavelengths different from one another are mounted on a substrate.

BACKGROUND

In recent years, LED elements, which are semiconductor elements having long lifetime and excellent drivability, have been widely used, for example, in illumination because they have, in addition, more miniaturized size, good light emitting efficiency and clear light emission color. In more recent years, there has been used LED light emitting devices of additive color mixing type which emit white light by enforcing concurrent light emission from LED elements for respective three colors; red (R), green (G) and blue (B).

For LED light emitting devices of additive color-mixing type, in order to realize light emission color with good color mixing property, the red, green and blue LED elements are known to be arranged on a substrate so that lines connecting these elements form an isosceles triangle (for example, JP 2011-233671).

SUMMARY

For the LED light emitting device in which lines connecting each LED element form an isosceles triangle, there is a problem that color mixing properties are insufficient, and among them, bands of violet and green lights, etc. significantly appear around white light.

Thus, an object of the present invention is to provide an LED light emitting device which can solve the above mentioned problem.

In addition, another object of the present invention is to provide an LED light emitting device with good color mixing property.

The LED light emitting device of the present application is an LED light emitting device including a rectangular substrate having a short-side and a long-side, a first LED element, a second LED element and a third LED element which are mounted on the surface of the substrate and emit light with wavelengths different from one another, wherein the first LED element and the second LED element are mounted on the substrate surface so that a first distance from the short-side to a mounting position of the first LED element in the long-side direction of the substrate and a second distance from the short-side to a mounting position of the second LED element in the long-side direction the same.

For the LED light emitting device of the present application, the positions where the first LED element and the second LED element are mounted on the substrate are preferably approximately at the center in the long-side direction of the substrate.

For the LED light emitting device of the present application, the second LED element and the third LED element are mounted on the substrate preferably so that the positions thereof in the short-side direction of the substrate are the same.

For the LED light emitting device of the present application, it is preferable that the first LED element is a red LED element, the second LED element is a green LED element, and the third LED element is a blue LED element.

The LED light emitting device of the present application has enabled an LED light emitting device with good color mixing property to be provided.

BRIEF DESCRIPTION OF THE DRAWINGS

Other features and advantages of the present LED light emitting device will be apparent from the ensuing description, taken in conjunction with the accompanying drawings, in which:

FIG. 3B depicts the surface of a substrate 11b on the side of the substrate 11a.

FIG. 4A is a figure (1) for explaining a manufacturing method of the LED light emitting device 1.

FIG. 4B is a figure (2) for explaining a manufacturing method of the LED light emitting device 1.

FIG. 4C is a figure (3) for explaining a manufacturing method of the LED light emitting device 1.

FIG. 4D is a figure (4) for explaining a manufacturing method of the LED light emitting device 1.

DESCRIPTION

The LED light emitting device according to the present invention will now be explained with reference to the Figures. However, it should be noted that the technical range of the present invention is not limited to these embodiments and covers the invention described in the claims and the equivalents thereof.

Figure 1A:
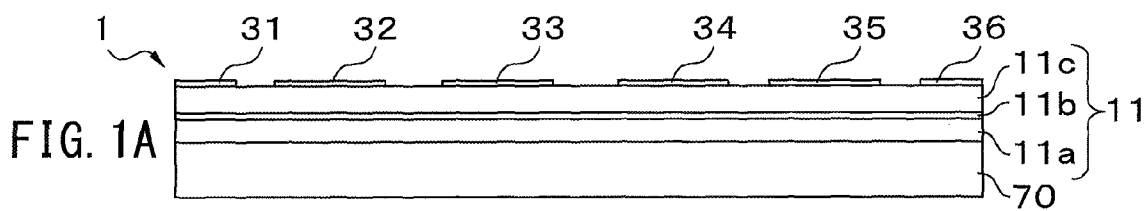
FIG. 1A is a plan view of an LED light emitting device 1.
Figure 1B:
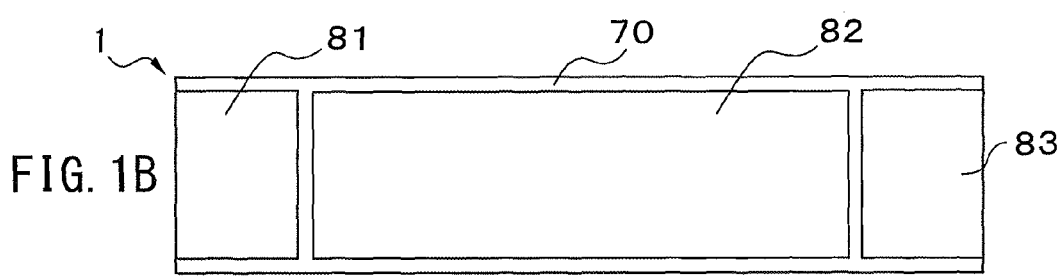
FIG. 1B is a front view of the LED light emitting device 1.
Figure 1C:
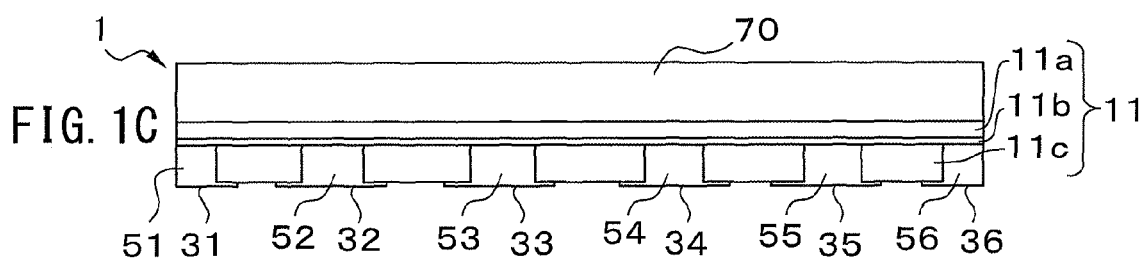
FIG. 1C is a bottom view of the LED light emitting device 1.
Figure 1D:
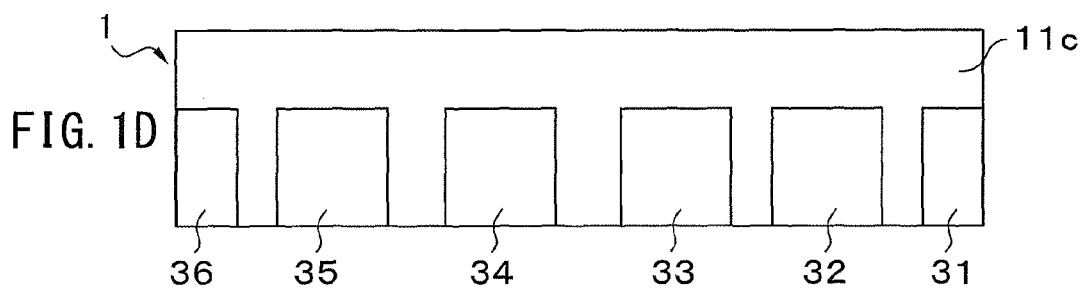
FIG. 1D is a back side view of the LED light emitting device 1.
Figure 1E:
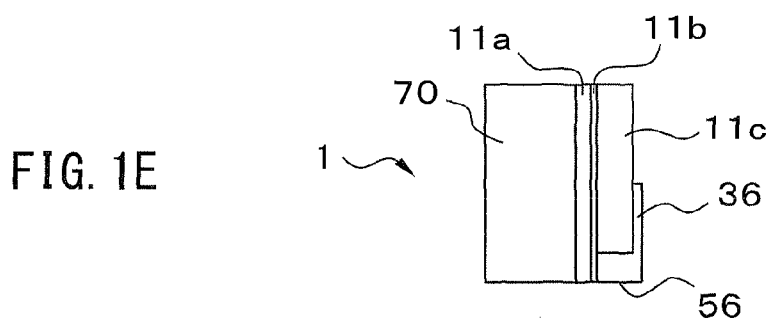
FIG. 1E is a right side view of the LED light emitting device 1.

FIG. 1A is a plan view of the LED light emitting device 1 according to the present invention. FIG. 1B is a front view of the LED light emitting device 1. FIG. 1C is a bottom view of the LED light emitting device 1. FIG. 1D is a back side view of the LED light emitting device 1. FIG. 1E is a side view of the LED light emitting device 1.

The LED light emitting device 1 includes a multi-layer substrate 11 including substrates 11a, 11b and 11c, a red LED element 4R, a green LED element 4G, a blue LED element 4B, Zener diodes 47, 48, wires 60 to 66, a reflection frame 70 and sealing resins 81, 82 and 83, etc.

The multi-layer substrate 11 is a multi-layer electrode substrate which includes the commonly bonded substrates 11a, 11b and 11c each mounting electrodes. The substrates 11a, 11b and 11c are insulating substrates, for example, composed of glass epoxy resin. The substrate 11a, 11b and 11c may be ceramic substrates or lead frame types.

The substrate 11a has a surface mounting the LED elements that has the reflection frame 70 formed from white resin and bonded thereon. The reflection frame 70 is integrally formed of four pieces of rectangular-shaped resins so that the longer sides of the rectangles are protruded in the eye direction in the front view.

Three spaces partially surrounded by the substrate 11a and the reflection frame 70 are sealed by sealing resins 81, 82, 83, respectively. The sealing resins 81, 82, 83 are composed of a resin that can transmit lights from the red LED element 4R, the green LED element 4G and the blue LED element 4B.

As depicted in the FIG. 1D, the substrate 11c has back surface electrodes 31, 32, 33, 34, 35 and 36 arranged thereon. As depicted in the FIGS. 1C and E, the back surface electrodes 31, 32, 33, 34, 35 and 36 are connected to mounting portions 51, 52, 53, 54, 55 and 56, respectively.

Figure 2:
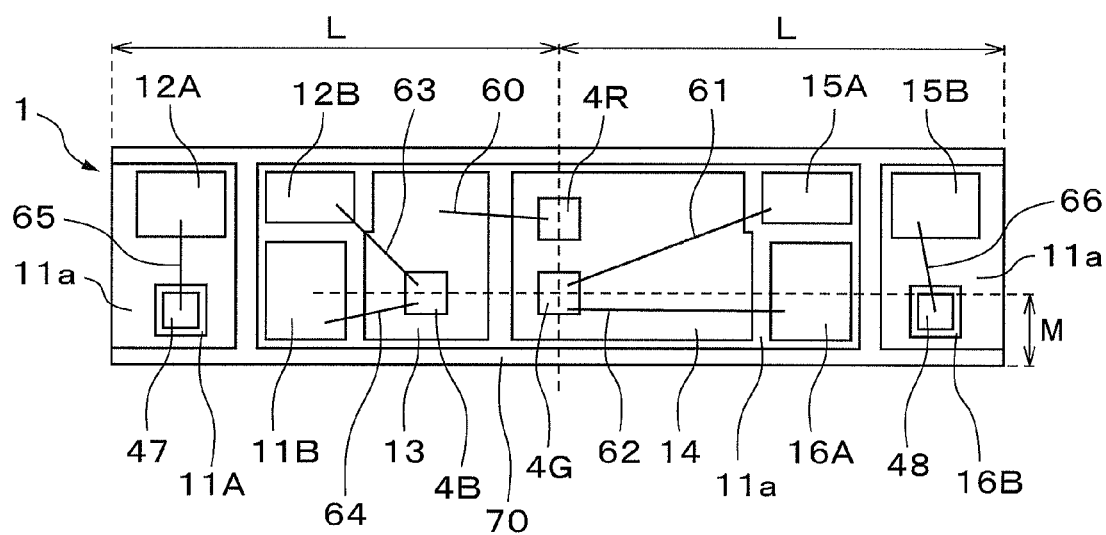
FIG. 2 depicts the arrangement of each LED element in the LED light emitting device 1.

FIG. 2 depicts the arrangement of each of the LED elements in the LED light emitting device 1. In other words, FIG. 2 depicts an aspect after the removal of sealing resins 81, 82, 83 from the LED light emitting device 1 depicted in FIG. 1B.

The substrate 11a has ten pieces of surface electrodes 11A, 11B, 12A, 12B, 13, 14, 15A, 15B, 16A and 16B arranged thereon isolated from one another. The surface electrodes 11A, 11B, 12A, 12B, 13, 14, 15A, 15B, 16A and 16B are layers plated with Cu, Ni, Ag, and Sn, etc. The substrate 11c has six pieces of back surface electrodes 31, 32, 33, 34, 35 and 36 arranged thereon isolated from one another. The back surface electrodes 31, 32, 33, 34, 35 and 36 are layers plated with Cu, Ni, Ag, and Sn, etc.

The red LED element 4R is an LED element emitting red light. The red LED element 4R is bonded to the surface electrode 14 by a die bonding material. The red LED element 4R, a top-to-bottom conductive element, is electrically connected to the surface electrode 14 and also to the surface electrode 13 by the wire 60.

The green LED element 4G is an LED element emitting green light. The green LED element 4G is bonded to the surface electrode 14 by a die bonding material. The green LED element 4G, an upper-surface terminal-type element, is electrically connected to the surface electrodes 15A and 16A by the wires 61, 62, respectively. The green LED element 4G is not electrically connected to the surface electrode 14.

The blue LED element 4B is an LED element emitting blue light. The blue LED element 4B is bonded to the surface electrode 13 by a die bonding material. The blue LED element 4B, an upper-surface terminal type element, is electrically connected to the surface electrodes 11B and 12B by the wires 63, 64, respectively. The blue LED element 4B is not electrically connected to the surface electrode 13.

The Zener diode 47 is bonded to the surface electrode 11A by a die bonding material. The Zener diode 47, a top-to-bottom conductive element, is electrically connected to the surface electrode 11A and also to the surface electrode 12A by the wire 65. The Zener diode 48 is bonded to the surface electrode 16B by a die bonding material. The Zener diode 48, a top-to-bottom conductive element, is electrically connected to the surface electrode 16B and also to the surface electrode 15B by the wire 66. The Zener diode 47 and the blue LED element 4B are connected in parallel to the back surface electrodes 31 and 32, respectively. The Zener diode 48 and the green LED element 4G are connected in parallel to the back surface electrode 35 and 36, respectively. The Zener diode 47 and Zener diode 48 improve resistance of the blue LED element 4B and the green LED element 4G against electrostatic discharge.

As depicted in FIG. 2, the positions of the red LED element 4R and the green LED element 4G in the long-side direction of the multi-layer substrate 11 are the same. The term "the positions in the long-side direction are the same" means that distances from the short-side end portion to the centers of the LED elements measured along the long-side direction, are the same. Thus, both of the central position of the red LED element 4R and that of the green LED element 4G are placed at a distance L from the right end portion (left end portion) of the multi-layer substrate 11. In addition, the red LED element 4R and green LED element 4G are placed approximately at the center of the multi-layer substrate 11. In other words, the length of the multi-layer substrate 11 in the long-side direction is 2L.

The positions of the blue LED element 4B and the green LED element 4G in the short-side direction of the multi-layer substrate 11 are the same. The term "the positions in the short-side direction are the same" means that distances from the long-side end portion to the centers of the LED elements measured along the short-side direction, are the same. Thus, both of the central position of the blue LED element 4B and that of the green LED element 4G are placed at a distance M from the lower end portion of the multi-layer substrate 11.

Figure 3A:
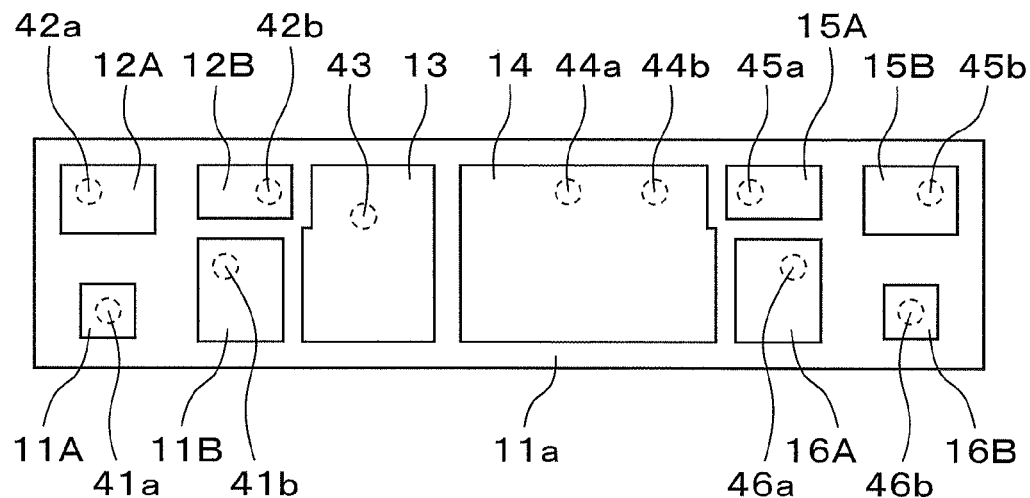
FIG. 3A depicts the surface of a substrate 11a on the side of a reflection frame 70.
Figure 3B:
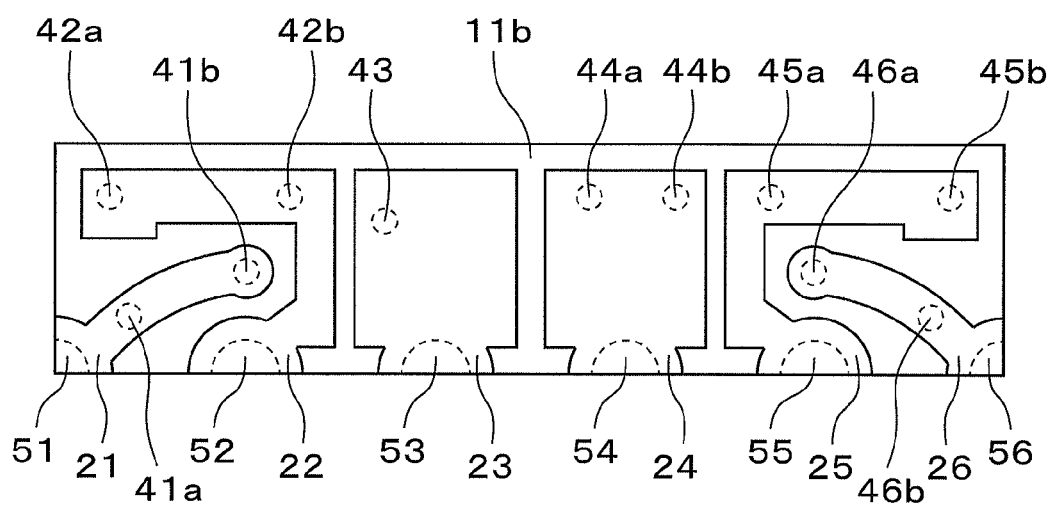
Figure 3C:
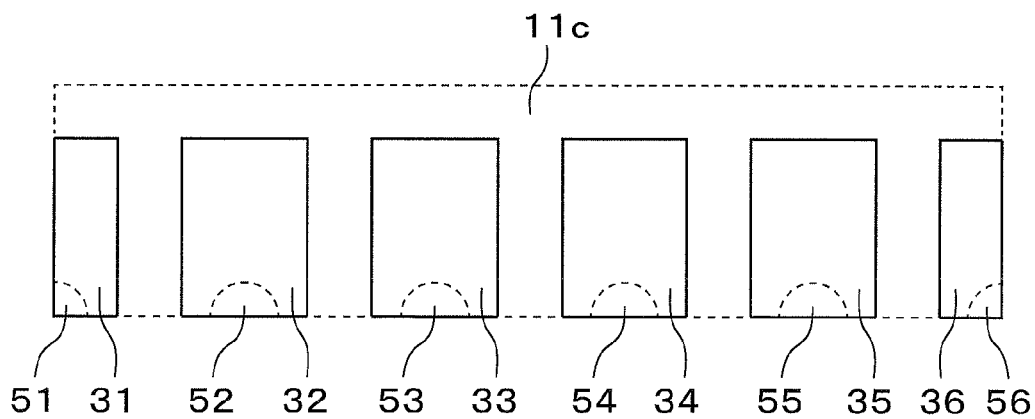
FIG. 3C depicts only back surface electrodes arranged on a substrate 11c.

FIG. 3A depicts the surface of the substrate 11a on the side of the reflection frame 70, FIG. 3B depicts the surface of the substrate 11b on the side of the substrate 11a, and FIG. 3C depicts only the back surface electrodes arranged on the substrate 11c.

FIG. 3A is the same as an aspect after the removal of wires from FIG. 2. In other words, the substrate 11a has the surface electrodes 11A, 11B, 12A, 12B, 13, 14, 15A, 15B, 16A and 16B arranged thereon.

As depicted in FIG. 3A and FIG. 3B, the substrate 11b has internal electrodes 21, 22, 23, 24, 25 and 26 arranged thereon. The surface electrode 11A is electrically connected to the internal electrode 21 via a through-hole 41a. The surface electrode 11B is electrically connected to the internal electrode 21 via a through-hole 41b. The surface electrode 12A is electrically connected to the internal electrode 22 via a through-hole 42a. The surface electrode 12B is electrically connected to the internal electrode 22 via a through-hole 42b. The surface electrode 13 is electrically connected to the internal electrode 23 via a through-hole 43. The surface electrode 14 is electrically connected to the internal electrode 24 via through-holes 44a and 44b. The surface electrode 15A is electrically connected to the internal electrode 25 via a through-hole 45a. The surface electrode 15B is electrically connected to the internal electrode 25 via a through-hole 45b. The surface electrode 16A is electrically connected to the internal electrode 26 via a through-hole 46a. The surface electrode 16B is electrically connected to the internal electrode 26 via a through-hole 46b.

As depicted in FIGS. 3B and C, the back surface electrode 31 is electrically connected to the internal electrode 21 via the mounting portion 51. The back surface electrode 32 is electrically connected to the internal electrode 22 via the mounting portion 52. The back surface electrode 33 is electrically connected to the internal electrode 23 via the mounting portion 53. The back surface electrode 34 is electrically connected to the internal electrode 24 via the mounting portion 54. The back surface electrode 35 is electrically connected to the internal electrode 25 via the mounting portion 55. The back surface electrode 36 is electrically connected to the internal electrode 26 via the mounting portion 56.

As described above, the surface electrodes 11A and 11B are electrically connected to the back surface electrode 31 and the mounting portion 51, the surface electrodes 12A and 12B are electrically connected to the back surface electrode 32 and the mounting portion 52, the surface electrode 13 is electrically connected to the back surface electrode 33 and the mounting portion 53. The surface electrode 14 is electrically connected to the back surface electrode 34 and the mounting portion 54, the surface electrodes 15A and 15B are electrically connected to the back surface electrode 35 and the mounting portion 55, and the surface electrodes 16A and 16B are electrically connected to the back surface electrode 36 and the mounting portion 56. When the LED light emitting device 1 is mounted on a mother board, etc., the mounting portions 51, 52, 53, 54, 55 and 56 are mounted on the corresponding electrodes arranged on the mother board, respectively. A pre-determined voltage is applied between the mounting portions 51 and 52 to drive the blue LED element 4B to emit light, the pre-determined voltage between the mounting portions 53 and 54 to drive the red LED element 4R to emit light, and the pre-determined voltage between the mounting portions 55 and 56 to drive the green LED element 4G to emit light.

FIGS. 4A to 4D are figures for explaining a manufacturing method of the LED light emitting device 1.

As depicted in FIG. 4A, on the back surface of the substrate 11a having the surface electrodes 11A, 11B, 12A, 12B, 13, 14, 15A, 15B, 16A and 16B arranged thereon, the substrate 11b having the internal electrodes 21, 22, 23, 24, 25 and 26 arranged thereon is laminated. At this time, the surface electrodes 11A to 16B are electrically connected to the internal electrodes 21 to 26 via the through-holes 41a, 41b, 42a, 42b, 43, 44a, 44b, 45a, 45b, 46a and 46b (see FIGS. 3A and 3B). Then, on the back side of the substrate 11b, the substrate 11c is arranged so as to be sandwiched between the substrate 11b and the back surface electrodes 31, 32, 33, 34, 35 and 36. According to the above, the multi-layer substrate 11 is formed which includes the integrated substrates 11a, 11b and 11c.

Then, as depicted in FIG. 4B, the top-to-bottom conductive red LED element 4R is bonded onto the surface electrode 14 by a die bonding material, and one terminal of the red LED element 4R is electrically connected to the surface electrode 14. In addition, the other terminal of the red LED element 4R is electrically connected to the surface electrode 13 by the wire 60.

In addition, the upper-surface terminal type green LED element 4G is bonded to the surface electrode 14 by a die bonding material so that the position of the element in the long-side direction of the multi-layer substrate 11 is approximately the same as that of the red LED element 4R. Two terminals of the green LED element 4G are electrically connected to the surface electrodes 15A and 16A by the wires 61 and 62, respectively. The green LED element 4G is not electrically connected to the surface electrode 14.

In addition, the upper-surface terminal type blue LED element 4B is bonded to the surface electrode 13 by a die bonding material so that the position of the element in the short-side direction of the multi-layer substrate 11 is approximately the same as that of the green LED element 4G. Two terminals of the blue LED element 4B are electrically connected to the surface electrodes 11B and 12B by the wires 63, 64, respectively. The blue LED element 4B is not electrically connected to the surface electrode 13.

In addition, the top-to-bottom conductive Zener diode 47 is bonded to the surface electrode 11A by a die bonding material, and one terminal of the Zener diode 47 is electrically connected to the surface electrode 11A. The other terminal of the Zener diode 47 is electrically connected to the surface electrode 12A by the wire 65. The top-to-bottom conductive Zener diode 48 is electrically connected to the surface electrode 16B by a die bonding material, and one terminal of the Zener diode 48 is electrically connected to the surface electrode 16B. The other terminal of the Zener diode 48 is electrically connected to the surface electrode 16B by the wire 66.

As depicted in FIG. 4C, the reflection frame 70 is bonded to the substrate 11a by an adhesive so that the red LED element 4R, the green LED element 4G and the blue LED element 4B are surrounded by the reflection frame 70.

As depicted in FIG. 4D, the approximately cuboid space 92 in which the red LED element 4R, the green LED element 4G and the blue LED element 4B are surrounded by the reflection frame 70 is sealed by a sealing resin 82 that can transmit the light from the red LED element 4R, the green LED element 4G and the blue LED element 4B. The approximately cuboid space 91 partially surrounded by the substrate 11a and the reflection frame 70 is sealed by a sealing resin 81 composed of the same material as that of the sealing resin 82. The approximately cuboid space 93 partially surrounded by the substrate 11a and the reflection frame 70 is sealed by a sealing resin 83 composed of the same material as that of the sealing resin 82, and the LED light emitting device 1 is completed. The sealing resin 81 and the sealing resin 83 may not be necessarily of the same type as that of the sealing resin 82.

Figure 5:
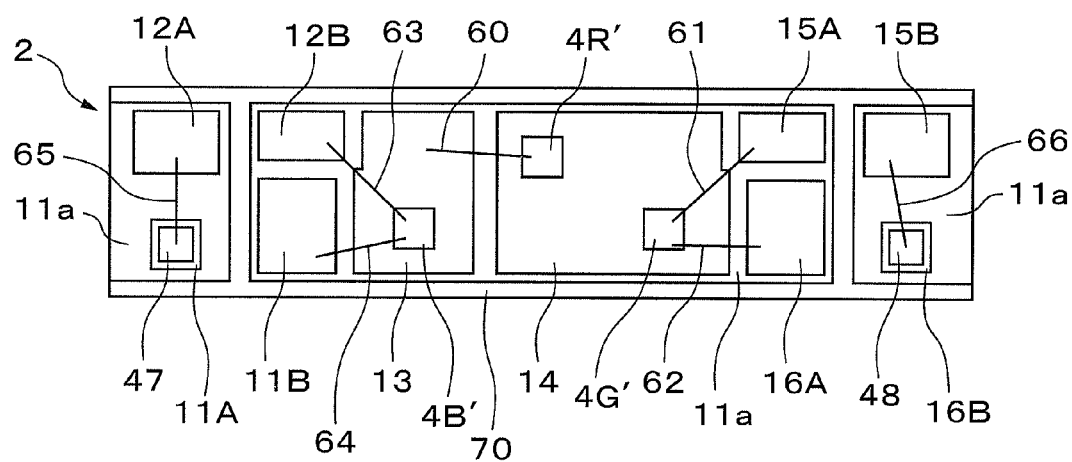
FIG. 5 depicts an LED light emitting device 2 for comparison.

FIG. 5 depicts the LED light emitting device 2 for comparison.

As depicted in FIG. 5, the LED light emitting device 2 is configured so that lines connecting the central position of the red LED element 4R', the central position of the green LED element 4G' and the central position of the blue LED element 4B' form an approximately isosceles triangle of which the vertical angle position is at the red LED element 4R'. Since the other configurations in the LED light emitting device 2 are the same as those in the LED light emitting device 1, the explanation therefor will be omitted.

Figure 6A:
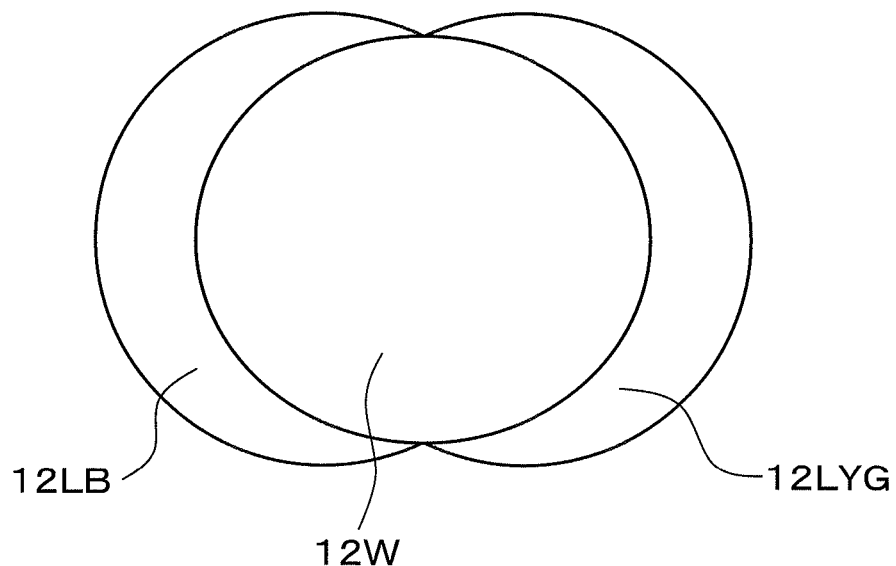
FIG. 6A is a schematic diagram for explaining the appearance of light emitted from the LED light emitting device 1.

FIG. 6A is a schematic diagram to explain the appearance of light emitted from the LED light emitting device 1. In other words, FIG. 6A is a schematic diagram which explains light emission colors observed in front of the LED light emitting device 1 that is emitting light.

The schematic diagram of FIG. 6A is based on the result of an experiment performed by using the LED light emitting device 1 fabricated as follows. Specifically, the multi-layer substrate 11 was a rectangle with a size of 4.5 mm length in the long-side direction and 1.1 mm length in the short-side direction. The central position of the red LED element 4R was at a distance of 2.25 mm along the long-side direction from the right or left end portion of the multi-layer substrate 11 and at a distance of 0.337 mm along the short-side direction from the upper end portion of the substrate. The central position of the green LED element 4G was at a distance of 2.25 mm along the long-side direction from the right or left end portion of the multi-layer substrate 11 and at a distance of 0.755 mm along the short-side direction from the upper end portion. The central position of the blue LED element 4B was at a distance of 1.725 mm along the long-side direction from the left end portion of the multi-layer substrate 11, at a distance of 2.775 mm along the long-side direction from the right end portion and at a distance of 0.755 mm along the short-side direction from the upper end portion. The above described shape and size, and the arrangement of the LED elements are one example, and the present application is not limited thereto.

As depicted in FIG. 6A, when the light emission of the LED light emitting device 1 is observed squarely, on the basis of a nearly circular white region 12W at the center, a light blue region 12LB is observed on the adjacent left of the white region 12W and a light yellow-green region 12LYG on the adjacent right of the white region 12W.

Figure 6B:
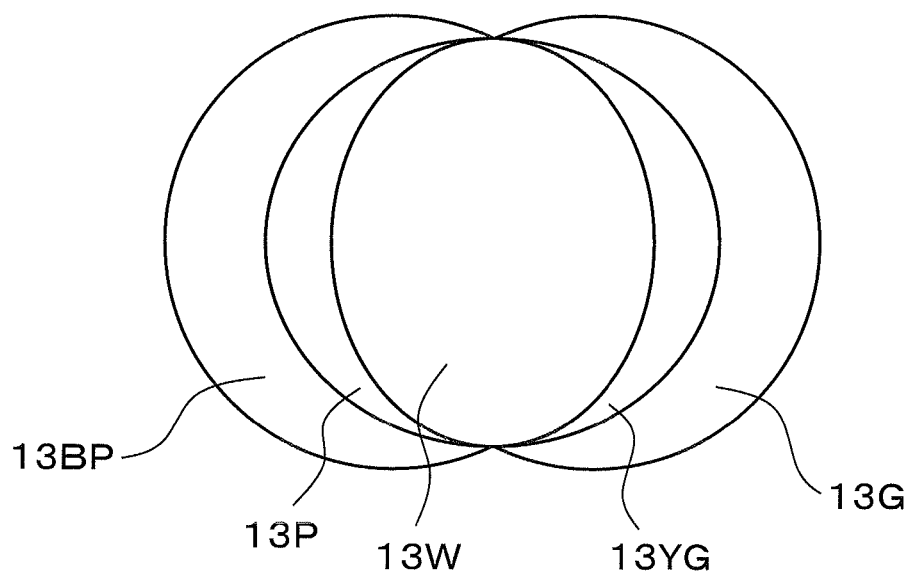
FIG. 6B is a schematic diagram for explaining the appearance of light emitted from the LED light emitting device 2.

FIG. 6B is a schematic diagram to explain the appearance of light emitted from the LED light emitting device 2. In other words, FIG. 6B is a schematic diagram which explains light emission color observed in front of the LED light emitting device 2 that is emitting light.

The schematic diagram of FIG. 6B is based on the result of an experiment performed by using the LED light emitting device 2 fabricated as follows. Specifically, the multi-layer substrate 11 was a rectangle with a size of 4.5 mm length in the long-side direction and 1.1 mm length in the short-side direction. The central position of the red LED element 4R' was at a distance of 2.25 mm along the long-side direction from the right or left end portion of the multi-layer substrate 11 and at a distance of 0.36 mm along the short-side direction from the upper end portion. The central position of the green LED element 4G' was at a distance of 1.68 mm along the long-side direction from the right end portion of the multi-layer substrate 11, at a distance of 2.82 mm along the long-side direction from the left end portion and at a distance of 0.755 mm along the short-side direction from the upper end portion. The central position of the blue LED element 4B was at a distance of 1.68 mm along the long-side direction from the left end portion of the multi-layer substrate 11, at a distance of 2.82 mm along the long-side direction from the right end portion and at a distance of 0.755 mm along the short-side direction from the upper end portion.

As depicted in FIG. 6B, when the light emission of the LED light emitting device 2 is observed squarely, on the basis of a vertically long and approximately ellipse white region 13W at the center, on the adjacent left of the white region 13W is observed a violet blue region 13P, again on the adjacent left of which is observed a blue-violet region 13BP. In addition, on the adjacent right of the white region 13W is observed a yellow-green region 13YG, again on the adjacent right of which is observed a yellow-green region 13YG.

From the comparison of FIG. 6A and FIG. 6B, it is shown that the white region 12W of FIG. 6A is larger than the white region 13W of FIG. 6B. In addition, the light blue region 12LB and the light yellow-green region 12LYG, which are regions other than the white color region in FIG. 6A, are narrower and lighter than the violet region 13P, the blue-violet region 13BP, the yellow-green region 13YG and the green region 13G, which are regions other than white color regions in FIG. 6B. According to the above, it is shown that the LED light emitting device 1 has a better color mixing property than the LED light emitting device 2.

In the LED light emitting device 1, the positions of the red LED element 4R and the green LED element 4G in the long-side direction of the multi-layer substrate 11 are the same and the positions of the green LED element 4G and the blue LED element 4B in the short-side direction of multi-layer substrate 11 are the same. Therefore, in the LED light emitting device 1, the light emission with the good color mixing property has been available. So long as the positions of the red LED element 4R and the green LED element 4G in the long-side direction of the multi-layer substrate 11 are the same, light emission with fairly good color mixing property can be available even if there is a little difference between the positions of the green LED element 4G and the blue LED element 4B in the short-side direction of the multi-layer substrate 11.

The preceding description has been presented only to illustrate and describe exemplary embodiments of the present LED light emitting device. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope.

What is claimed is:

1. An LED light emitting device comprising:
   a rectangular substrate having a short-side and a long-side;
   a total of three light-emitting diode (LED) elements consisting of a first LED element, a second LED element and a third LED element that emit light with wavelengths different from one another; and
   a reflecting member which is arranged on a surface of the substrate so that the first LED element, the second LED element and the third LED element are surrounded therein,
   wherein the first LED element and the second LED element are mounted on the surface of the substrate so that a first distance from the short-side to a mounting position of the first LED element in a long-side direction of the substrate and a second distance from the short-side to a mounting position of the second LED element in the long-side direction are the same,
   the center of the mounting position of the first LED element and the center of the mounting position of the second LED element are located in a center of the substrate in the long-side direction of the substrate,
   the second LED element and the third LED element are mounted on the surface of the substrate so that the center of the mounting position of the second LED element and a center of a mounting position of the third LED element in a short-side direction of the substrate are the same,
   the first LED element is electrically connected to a first pair of electrodes, the second LED element is electrically connected to a second pair of electrodes, and the third LED element is electrically connected to a third pair of electrodes so that a pre-determined voltage can be applied to each of the first LED element, the second LED element and the third LED element to emit light,
   the reflecting member comprises a frame having a first side which is arranged on the substrate in the long-side direction of the substrate, a second side which is arranged on the substrate parallel to the first side at third side which is arranged on the substrate and joins the first side with the second side in the short-side direction of the substrate, and a fourth side which is arranged on the substrate parallel to the third side, and the short-side direction is a direction which is parallel to the short-side and the long-side direction is a direction which is parallel to the long-side.

2. The LED light emitting device according to claim 1, wherein the first LED element is a red LED element, the second LED element is a green LED element, and the third LED element is a blue LED element.

3. The LED light emitting device according to claim 1, further comprising a Zener diode which is electrically connected with at least one of the first LED element, the second LED element and the third LED element, wherein the Zener diode is arranged on the surface of the substrate outside of the third side or the fourth side of the frame.

4. The LED light emitting device according to claim 1, further comprising a first sealing resin for covering the first LED element, the second LED element and the third LED element, wherein the first sealing resin is disposed within a first area which is surrounded by the first side, the second side, the third side and the fourth side of the frame.

5. The LED light emitting device according to claim 3, further comprising a second sealing resin for covering the Zener diode, wherein the second sealing resin is disposed within a second area which is surrounded only by the first side, the second side and the third side of the frame, or a third area which is surrounded only by the first side, the second side and the fourth side of the frame.

* * * * *